United States Patent [19]
de Chambost

[11] Patent Number: 4,798,953
[45] Date of Patent: Jan. 17, 1989

[54] ELECTRONIC BEAM DEVICE FOR PROJECTING AN IMAGE OF AN OBJECT ON A SAMPLE

[75] Inventor: Emmanuel de Chambost, Molieres, France

[73] Assignee: THOMSON-CSF, Paris, France

[21] Appl. No.: 37,343

[22] Filed: Apr. 13, 1987

[30] Foreign Application Priority Data

Apr. 15, 1986 [FR] France ................. 86 05363

[51] Int. Cl.$^4$ ............................................. G01N 23/00
[52] U.S. Cl. ................................. 250/310; 250/396 R; 250/492.2; 250/396 ML
[58] Field of Search ................. 250/309, 310, 396 R, 250/396 ML, 492.2, 492.21, 398, 492.23

[56] References Cited

U.S. PATENT DOCUMENTS

| | | | |
|---|---|---|---|
| 2,749,464 | 6/1956 | Le Poole | 250/396 ML |
| 2,880,324 | 3/1954 | Van Dorsten | 250/396 ML |
| 3,634,684 | 1/1972 | Sato | 250/396 R |
| 3,787,696 | 1/1974 | Dao et al. | 250/310 |
| 3,851,172 | 11/1974 | Ozasa et al. | 250/396 ML |
| 4,145,597 | 3/1979 | Yasuda | 250/492.23 |
| 4,145,615 | 3/1979 | Sumi | 250/396 ML |
| 4,362,942 | 12/1982 | Yasuda | 250/398 |
| 4,508,967 | 4/1985 | Boissel et al. | 250/396 R |
| 4,675,524 | 6/1987 | Frosien et al. | 250/309 |
| 4,701,623 | 10/1987 | Beasley | 250/396 R |

Primary Examiner—Bruce C. Anderson
Attorney, Agent, or Firm—Oblon, Fisher, Spivak, McClelland & Maier

[57] ABSTRACT

An electronic beam device is provided for projecting the image of an object on a sample, including two electromagnetic lens reduction stages. A single insulating tube is disposed between an object and the same plane, this tube having an inner metallized face.

9 Claims, 1 Drawing Sheet

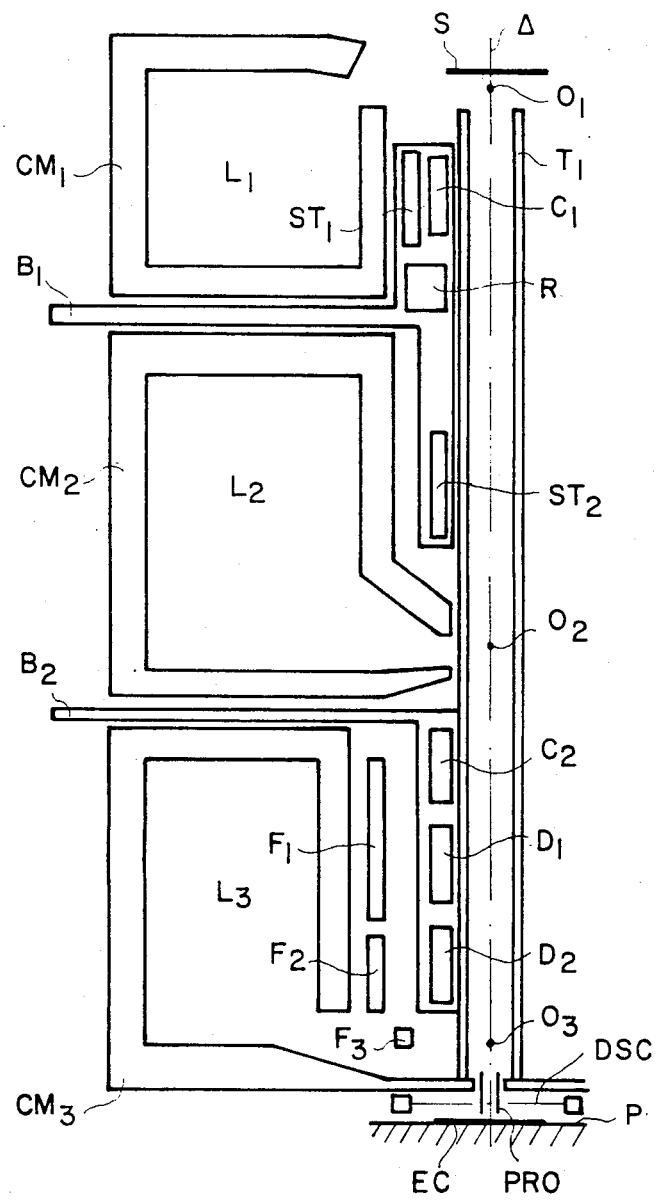

ELECTRONIC BEAM DEVICE FOR PROJECTING AN IMAGE OF AN OBJECT ON A SAMPLE

BACKGROUND OF THE INVENTION

The present invention relates to an optical electronic device for projecting the image of an object on a sample.

The present invention relates more particularly to a charged particle beam system designed for use in the manufacture of large scale integrated circuit configurations.

It is current practice to use charged particle beams ions or electrons, in the planar technology used for manufacturing semiconductor circuits or components for producing an image on layers sensitive to these particles for causing physico-chemical transformations through windows which are drawn on the layers sensitive to the action of the particle beams. The use of charged particle beams in the operation of drawing and etching sensitive layers, which is called microlithography, is described for example in the book by E. Munro: "Electron Beam Lithography in Applied Charged Particle Optics", Septier Academic Press (1980).

From the point of view of the semiconductor sample, as is described in this publication, it is conventional to use either a beam whose density has a Gaussian geometric distribution, or a beam with defined shape, or else a beam with defined shape but which may be varied depending on the exposure of a semiconductor sample. The present invention relates to the machines producing beams of the two above latter mentioned types.

A variable shaped beam is described more particularly in the communication by J. Trotel: "Electron Beam Direct Writing Lithographic System" published in the "Proceedings on the 9th International Conference on Electron Ion Beam Science and Technology".

All the electronic or ionic microlithographic systems include, for aiming the beam at a given point of the sample, both a mechanical movement of the table on which the sample is disposed and movement of the beam using magnetic or electrostatic methods. The movement of the table may be measured with great accuracy by means of a laser interferometer as is described in the French patent application No. FR-A-2 220 073.

When the beam is not deflected by the magnetic or electrostatic means, it is focused on a so called Gaussian plane. It is usual to situate the plane of the sample in the vicinity of the Gaussian plane. The magnetic means for deflecting the beam generally consist of windings through which an electric current passes and which are arranged in different ways and the electrostatic means consist of electrodes situated in the vicinity of the path of the beam. When the deflection of the beam is increased, there appear in the Gaussian plane both defocusing of the beam and non linearity between the electric signals energizing the magnetic or electrostatic deflectors and the deflected distance of the beam with respect to the axis. These defects are called geometric aberrations and a description thereof is made in the above publication by B. Munro. The whole of the aberrations must be less than the desired accuracy.

The problem of minimizing these aberrations is also described in this publication.

It is shown that these aberrations can be minimized by distributing the deflection over 2, 3 stages or even more, each of these stages having their efficiency determined in a given ratio as well as their respective azimuthal orientations.

The maximum is drawn from such arrangements when one or more of these stages are immersed, partially or completely, in the magnetic field of the lens.

It is important to be able to carry out the deflection variations, very rapidly, stabilization of the beam having to take place with the accuracy required by the system. The limitations on this rapidity are greater with magnetic deflectors because of the self inductance effect and because of the appearance of Eddy currents in conducting parts close to the deflectors.

It is current practice to divide the field accessible to the beam into zones or "subfields" to carry out rapid variations inside a subfield by means of an electric deflector and to direct the beam from one subfield to another by means of a slower magnetic deflector, the Eddy currents being reduced below an acceptable limit by guiding the magnetic field lines of the deflectors in non conducting magnetic parts, for example ferrites, for preventing said field lines from circulating in the pole pieces of the lenses which are generally conducting. To minimize the appearance of Eddy currents in the metal parts which surround the path of the beam, the thickness of the conducting layer must be reduced as much as possible, for example using thin layer techniques on an insulating tube.

Another type of aberration which limits the resolution of the electron beam microlithographic systems comes from Coulombien effects, that is to say from the repulsion between electrons in the beam. This effect becomes important for variable shaped beams, because they allow a higher working electronic current to be disposed on the sample. It has been demonstrated in the article "Transverse Coulombien Aberrations in Electron Lithography Probes" appearing in "Optik 62", No. 2, page 189, 1982 that the aberration $\delta r$ called space charge conforms to the relationship:

$$\delta_r = \alpha I L / \alpha^2$$

in which relationship I designates the working current, L the path between a diaphragm called object stencil and the plane of the sample and $\alpha$ the semiaperture of the beam in the plane of the sample.

Furthermore, for limiting the charges in the beam to what is strictly necessary, the French patent application No. Fr-A-2 513 425 proposes disposing the aperture limitation diaphragm immediately downstream of the source so that this diaphragm is optically conjugate with the optical center of the last lens.

In addition to the theoretical limitations which have just been described, there also exist in any microlithography system problems of contaimination as a function of the time of use which cause a drift of the beam and a loss of resolution of the system. Cleaning is an operation which may be long and delicate.

The present invention provides an electronic optical device for projecting the reduced image of an object on a sample with a reduction factor whose order of size is typically 1/50 for a typical acceleration voltage of 20 kV.

With this device, a microlithography system may be given the following typical properties:
resolution and precision better than 0.1 $\mu$m, all aberrations considered together;
speed of directing the beam;
working current on the sample greater than 4 $\mu$A;

reduction of contamination risks, simplification of assembly and cleaning, and zero or negligible magnetic field at the level of the sample.

For this, and in particular so as to obtain a reduction of the risks of contamination and simplification of assembly and cleaning, the invention provides a device in which no electrostatic deflector is used and having a single metallized insulating tube covering the path of the object beam of the sample. An arrangement is also provided of the different members which form the device of the invention allowing the different requirements mentioned above to be satisfied while maintaining the object sample distance within reasonable limits.

What distinguishes the invention more particularly from the prior art systems is that it deliberately privileges the reduction of Coulombien aberrations while accepting a reduction of the addressed field.

SUMMARY OF THE INVENTION

The invention provides an electron beam optical device for projecting the image of an object on a sample plane, including two electromagnetic lens reduction stages having pole pieces and with a given optical axis, including a single insulating tube with metallized inner face protecting the path of the electron beam between the object and the lower pole piece of the last lens.

BRIEF DESCRIPTION OF THE DRAWINGS

The invention will be better understood and other features and advantages will be clear from reading the following description with reference to the accompanying single FIGURE.

The single FIGURE shows a device of the invention.

DETAILED DESCRIPTION OF THE INVENTION

The single FIGURE shows schematically a device of the invention.

The device shown in the FIGURE is in actual fact a partial half section of a microlithography apparatus, which partial view is limited to the essential elements of the invention, that is to say the lower part of the apparatus included between a diaphragm S defining the shape of the particle beam and a sample EC. The non reflected beam has as axis of symmetry the optical axis $\Delta$ of the device.

In what follows, this diagram S will be called the object stencil. In the case of a variable shaped beam system, this stencil S may be a diaphragm having at least two edges forming a right angle. The image of another upstream stencil not shown is also formed on the same plane, as is well known.

The final stage shown in FIG. 1 includes three stages, each having an electromagnetic lens: $L_1$ to $L_3$ with pole pieces $CM_1$ to $CM_3$.

The optical centers of the electromagnetic lenses are respectively $O_1$, $O_2$ and $O_3$.

The electromagnetic lens $L_1$ is situated materially downstream of stencil S, but its optical center $O_1$ is very close to the stencil (typically at less than 10 mm). The current for energizing lens $L_1$ is adjusted so as to conjugate, in the optical center $O_3$ of lens $L_3$, the image of an aperture limitation diaphragm, not shown, situated in the electronic column upstream of the device.

By way of example lens $L_2$ has its optical center $O_2$ situated at 100 mm from the stencil S. The last lens $L_3$ has its optical center $O_3$ situated at about 65 mm from the optical center $O_2$. The distance between $O_3$ and the plane of sample P is about 20 mm.

Besides the lenses $L_1$ to $L_3$, the device includes, at the level of lens $L_1$:

a magnetic stigmator $ST_1$ whose role is to correct the orthogonality of stencil S, a static magnetic deflector $C_1$ intended to center the beam in lens $L_2$, and a coaxial coil R energized for correcting the orientation of the image of the stencil in the plane of the sample. The convergence of coil R is negligible.

The device further includes a stigmator $ST_2$ for correcting the astigmatism taken in the conventional meaning of the term, that is to say different focusing on the sample in two orthogonal directions considered, at the level of lens $L_2$, and a dynamic deflector $C_2$ for centering the beam in lens $L_3$. Finally, in the FIGURE, two elements $D_1$ and $D_2$ have been shown which are the two stages, placed in series, of a dynamic deflector for addressing the beam on the plane P of the sample. Elements are disposed at the level of lens $L_3$.

The elements $C_1$-$C_2$ and $D_1$-$D_2$ are each energized by two independent currents for adjusting the deflection of the beam both in amplitude and in rotation.

Elements $C_1$, $ST_1$, R and $ST_2$ may be combined in the same molded block $B_1$ whose output connections would be inserted between lenses $L_1$ and $L_2$. Similarly, elements $C_2$, $D_1$ and $D_2$ may be combined in another molded block $B_2$ whose output connections would be inserted between lenses $L_2$ and $L_3$.

The device also includes the elements $F_1$, $F_2$ and $F_3$ which are non conducting magnetic material pieces, for example made from ferrite, for guiding the magnetic field lines external to the deflector $D_1$-$D_2$ and thus avoiding the generation of Eddy currents in conducting parts.

The purose of the two last lenses $L_2$ and $L_3$ is to cause reduction of the object represented by the object stencil S in a typical ratio of 1/20 to 1/100. The purpose of the first lens $L_1$ is, as was mentioned above, to adjust the image of the stencil S in the optical center $O_3$ of the third lens $L_3$.

The assembly is completed by a semiconductor detector DSC situated between the pole piece $CM_3$ of the last lens $L_3$ and the sample. This latter is protected by a special entirely metal piece PRO. The purpose of detector DSC is to detect the secondary electrons emitted by sample ES for adjustment purposes. It has a symmetry of revolution.

In a main feature of the invention, a single tube $T_1$ is provided between the object S and the sample EC. This tube is made from an insulating material which is metallized on the inside so as to allow the flow of the electron charges. The use of a single tube between object and sample gives a decisive advantage with respect to the prior art lighography machines in which accessories are disposed between object and sample such as electrostatic plates or aperture limitation diaphragm.

The special piece PRO for protecting the detector DSC has a smaller diameter than that of tube $T_1$ but the inner diameter is in no case struck by the electrons whatever the addressed position of the beam. The outer diameter of the single tube $T_1$ is typically 1cm. It may be made from alumina and the metallization may be effected by the so called "electroless" deposition including a copper coupling layer and a gold plated protection layer.

Under the conditions which have just been described, the total distance between object (stencil S) and sample may be reduced to less than 20 cm for a reduction of 1/50 with an acceleration voltage of the electrons of 20 kV.

What is claimed is:

1. An electronic beam optical device for projecting the image of an object onto a sample plane, said beam having an axis of symmetry, said device comprising:
    a single insulating tube having an inner metalized face for protecting the path of the electron beam, said tube being continuous without interruption and empty of all apparatus, the tube having an axis which coincides with the beam axis;
    a first lens arranged around said tube and having a pole piece and an optical center on the axis of the tube, said first lens being arranged between the object and the sample plane;
    a second lens being arranged around said tube and having a pole piece and an optical center on the axis of the tube, said second lens being arranged between said first lens and said sample plane, for reducing the image of the object;
    a third lens being arranged around said tube and having a pole piece and an optical center on the axis of the tube, said third lens being arranged between said first lens and said sample plane, for reducing the image of the object;
    said first lens adjusting the image of the object in the optical center of said third lens; and
    said tube extending from the object to the bottom of the pole piece of said third lens.

2. The device as claimed in claim 1, wherein said static magnetic deflector, said stigmator, said rotation correction coil and said another stigmator are arranged inside a first molded block having output connections which extend between said first and second lenses.

3. The device as claimed in claim 1, wherein said static magnetic deflector and said dynamic magnetic deflector are arranged inside a second molded block having output connections which extend between said second and third lenses.

4. The device as claimed in claim 1, further comprising:
    a tubular metal piece extending from the end of said tube at the bottom of said pole piece of said third lens in the direction of said sample plane; and
    detector means arranged around said tubular metal piece for detecting secondary electrons from said sample.

5. The device as claimed in claim 1, wherein said second and third lenses cause a reduction ratio of from 1/20 to 1/100.

6. The device as claimed in claim 1, also including a static magnetic deflector, a stigmator and a rotation correction coil at the level of said first lens; another stigmator at the level of the second reduction lens, a static magnetic deflector and a dynamic magnetic deflector at the level of said third lens.

7. The device as claimed in claim 1, wherein said single insulating tube is an alumina tube and the metallization is a metal deposit including, superimposed, a first copper layer and a second gold layer.

8. The device as claimed in claim 1, forming part of a microlithography apparatus.

9. The device as claimed in claim 8, wherein said microlithography apparatus includes a variable shaped electron beam.

* * * * *